United States Patent
An et al.

(10) Patent No.: US 9,145,812 B2
(45) Date of Patent: Sep. 29, 2015

(54) THERMOELECTRIC GENERATOR OF VEHICLE

(71) Applicant: Hyundai Motor Company, Seoul (KR)

(72) Inventors: Ho-Chan An, Hwasung-shi (KR); Jong-Ho Seon, Incheon-shi (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 93 days.

(21) Appl. No.: 13/660,762

(22) Filed: Oct. 25, 2012

(65) Prior Publication Data

US 2013/0145750 A1    Jun. 13, 2013

(30) Foreign Application Priority Data

Dec. 12, 2011  (KR) .................. 10-2011-0132735

(51) Int. Cl.
| | |
|---|---|
| *F01N 3/00* | (2006.01) |
| *F01N 3/02* | (2006.01) |
| *F01N 5/02* | (2006.01) |
| *F01N 1/00* | (2006.01) |
| *H01L 35/28* | (2006.01) |
| *F02M 31/08* | (2006.01) |
| *H01L 35/30* | (2006.01) |

(52) U.S. Cl.
CPC .............. *F01N 5/025* (2013.01); *H01L 35/30* (2013.01); *Y02T 10/16* (2013.01)

(58) Field of Classification Search
USPC ........... 60/298, 320, 324; 136/205, 212, 218, 136/210; 165/52
See application file for complete search history.

(56) References Cited

U.S. PATENT DOCUMENTS

| | | |
|---|---|---|
| 3,197,342 A | 7/1965 | Neild, Jr. |
| 3,794,527 A | 2/1974 | Kim |
| 5,625,245 A | 4/1997 | Bass |
| 7,150,147 B2 | 12/2006 | Murata |
| 7,610,993 B2 | 11/2009 | Sullivan |
| 7,687,704 B2 | 3/2010 | Shimoji et al. |
| 7,802,424 B2 | 9/2010 | Kanzawa et al. |
| 7,921,640 B2 | 4/2011 | Major |
| 8,656,710 B2 | 2/2014 | Bell et al. |
| 8,800,263 B2 | 8/2014 | Eder et al. |
| 2005/0172993 A1* | 8/2005 | Shimoji et al. ................ 136/208 |

(Continued)

FOREIGN PATENT DOCUMENTS

| | | |
|---|---|---|
| EP | 2 180 534 A1 | 4/2010 |
| JP | 2005-223131 A | 8/2005 |

(Continued)

*Primary Examiner* — Audrey K Bradley
(74) *Attorney, Agent, or Firm* — Morgan, Lewis & Bockius LLP

(57) ABSTRACT

A thermoelectric generator apparatus of a vehicle may include a high temperature member, through which exhaust gas passes, a low temperature member, which maintains a temperature lower than a temperature of the high temperature member, and which includes a first coolant pipe holder supporting one of coolant pipes, a heat transfer plate which extends from the first pipe holder and may be located opposite to a corresponding high-temperature member, and a second coolant pipe holder formed on the other side of the heat transfer plate and supporting another of the coolant pipes, and a thermoelectric module disposed between the high temperature member and the low temperature member.

5 Claims, 4 Drawing Sheets

(56) References Cited

U.S. PATENT DOCUMENTS

| | | | |
|---|---|---|---|
| 2006/0179820 A1* | 8/2006 | Sullivan | 60/275 |
| 2009/0126772 A1 | 5/2009 | Machida | |
| 2010/0186399 A1 | 7/2010 | Hüttinger | |
| 2010/0186422 A1 | 7/2010 | Yang et al. | |
| 2011/0146743 A1 | 6/2011 | Oesterle et al. | |
| 2011/0308560 A1 | 12/2011 | Arbuckle et al. | |
| 2012/0060484 A1* | 3/2012 | Eder et al. | 60/320 |
| 2012/0118344 A1 | 5/2012 | Schluck et al. | |

FOREIGN PATENT DOCUMENTS

| | | |
|---|---|---|
| JP | 2006-314180 A | 11/2006 |
| JP | 2007-37319 A | 2/2007 |
| JP | 2007-154698 A | 6/2007 |
| JP | 2007-210561 A | 8/2007 |
| JP | 2007-236122 A | 9/2007 |
| JP | 2008-189162 A | 8/2008 |
| JP | 2009-278767 A | 11/2009 |
| JP | 2010-245265 A | 10/2010 |
| KR | 10-2011-0010782 A | 2/2011 |

* cited by examiner

A—A'

THERMOELECTRIC GENERATOR OF VEHICLE

CROSS-REFERENCE TO RELATED APPLICATION

The present application claims priority to Korean Patent Application No. 10-2011-0132735, filed on Dec. 12, 2011, the entire contents of which is incorporated herein for all purposes by this reference.

BACKGROUND OF THE INVENTION

1. Field of the Invention

The present invention relates to a thermoelectric generator of vehicle, and more particularly, to a thermoelectric generator of vehicle, which uses the heat of the exhaust gas of an automobile to generate electricity.

2. Description of Related Art

A thermoelectric element is an element, which uses a thermoelectric phenomenon, in which thermal energy is converted to electric energy by converting the temperature difference between the two ends of an element into electricity, or in which electric energy is converted to thermal energy by having electricity run through an element and by causing the temperature difference in the two ends. Such thermoelectric element is used in a small scale cooling, heating or generating device.

When a thermoelectric element is used in a small scale generating device, it is called a thermoelectric generation device or a thermoelectric generator. This device is mainly used in a power supply unit of a wireless communication device, of a spaceship and of a nuclear-powered submarine as well as in a thermoelectric generator installed in an exhaust system of a vehicle.

FIG. 1 is a cross-sectional view illustrating a thermoelectric generator of a vehicle.

As illustrated, a thermoelectric generator installed in an exhaust system of a vehicle 10 comprises; a hexagonal exhaust heat recovering device 40, which high-temperature exhaust gas passes through; a cooling device 30, which is installed outside of the exhaust heat recovering device 40 and inside of which coolant passes through; and the multitude of thermoelectric modules 20, which are in contact with the exterior of the exhaust heat recovering device 40 and with the interior of the cooling device 30 to generate electricity using the temperature difference between the two ends.

Inside the exhaust heat recovering device 40, high-temperature exhaust gas runs and it conveys thermal energy to the thermoelectric modules 20. Inside the cooling device 30 is formed a cooling pipe, which increases the temperature difference between the interior of the thermoelectric modules 20 in contact with the exhaust heat recovering device 40 and the exterior of the thermoelectric modules 20 in contact with the cooling device 30. As the temperature difference between the interior and the exterior of the thermoelectric module increases 20, the efficiency of the thermoelectric generator installed in the exhaust system of a vehicle increases.

In order to generate lots of electricity in a thermoelectric generator, i.e. to increase the thermoelectric generation efficiency, thermal energy of the exhaust gas must be conveyed to the thermoelectric modules efficiently. However, in the traditional thermoelectric generator of a vehicle, thermal energy of the exhaust gas is not conveyed to the high temperature member sufficiently, so the recovery rate of the thermal energy of the exhaust gas drops and hence, the thermoelectric efficiency of a thermoelectric generator drops.

Also, in the traditional thermoelectric generator of a vehicle, although a cooling device 30 occupies a great area, the heat-exchange area is small, and therefore, the heat conveyance rate is low compared to the size, and the efficiency of thermoelectric generation is low.

The information disclosed in this Background of the Invention section is only for enhancement of understanding of the general background of the invention and should not be taken as an acknowledgement or any form of suggestion that this information forms the prior art already known to a person skilled in the art.

BRIEF SUMMARY

Various aspects of the present invention are directed to providing a thermoelectric generator apparatus of a vehicle having a high temperature member, through which exhaust gas passes, a low temperature member, which maintains a temperature lower than a temperature of the high temperature member, and which may include a first coolant pipe holder supporting one of coolant pipes, a heat transfer plate which extends from the first pipe holder and is located opposite to a corresponding high-temperature member, and a second coolant pipe holder formed on the other side of the heat transfer plate and supporting another of the coolant pipes, and a thermoelectric module disposed between the high temperature member and the low temperature member, wherein the thermoelectric module is formed by joining a P-typed semiconductor and an N-typed semiconductor and generates electricity using thermoelectric phenomenon caused by a temperature difference between the high temperature member and the low temperature members.

The high temperature member may include a bypass pipe, which is formed inside the high temperature member, and through which a part of the exhaust gas selectively bypasses, a bypass valve, which is installed in an end of the bypass pipe and controls an emission of a bypassed exhaust gas, an elastic member elastically biasing the bypass valve against the bypass pipe, and a heat exchange mesh positioned between the bypass pipe and the high temperature member, wherein the heat exchange mesh conveys the exhaust gas to the outside and thermal energy of the exhaust gas to the thermoelectric module.

The elastic member is made up of shape memory wire.

The high temperature member may have a hexagonal cross section and the number of thermoelectric modules and the number of low temperature members are 6.

The bypass valve closes the bypass pipe when a temperature of the exhaust gas is lower than a predetermined degree, and opens the bypass pipe when the temperature of the exhaust gas is higher than the predetermined degree.

The coolant pipes are connected to a coolant distribution member and a coolant catchment member.

According to a thermoelectric generator of a vehicle of the present invention, the effect of the size of the entire thermoelectric generator being small while the area where the exhaust gas is in contact with the thermoelectric modules is large can be brought about.

Also, the effect of the fuel efficiency being enhanced because it is installed in the vehicle's engine and generates electricity so as to help the generator charge the batteries can be brought about.

Since a heat exchange mesh is installed between the high temperature member and the thermoelectric modules, the contact area with the exhaust gas is increased, and as a result, there is not only the effect of the thermal energy of the exhaust gas being conveyed to the thermoelectric modules more efficiently, but also the effect of the noise of the exhaust gas passing through it being reduced.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
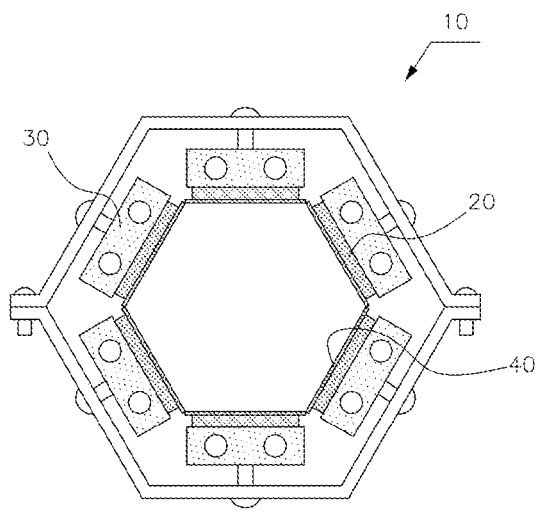
FIG. 1 is a cross sectional view of a traditional thermoelectric generator of a vehicle.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Reference will now be made in detail to various embodiments of the present invention, examples of which are illustrated in the accompanying drawings and described below. While the invention will be described in conjunction with exemplary embodiments, it will be understood that the present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

Hereafter, with reference to the attached drawings, the exemplary embodiment of the present invention will be described in detail. Before proceeding, it should be noted that the terminologies and words used on this specification and in the claims are not to be interpreted solely as the general or dictionary meanings, and they should be interpreted as the meanings and the concept which correspond with the technological ideas of the present invention based on the principle that the inventor can properly define the concept of the terminologies in order to explain his own invention in the best possible way. Therefore, the compositions described in the exemplary embodiments and the drawings of this specification are merely the most preferred types of embodiment and they do not represent the entire technological ideas of the present invention, and thus, it should be understood that there can be a variety of equivalents and alterations, which can replace these embodiments at the time of filing this application.

Figure 2:
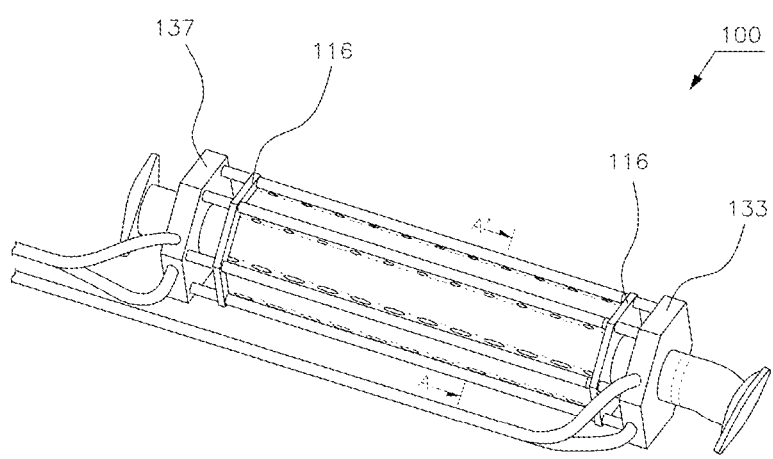
FIG. 2 is a perspective view of a thermoelectric generator of a vehicle according to an exemplary embodiment of the present invention.
Figure 3:
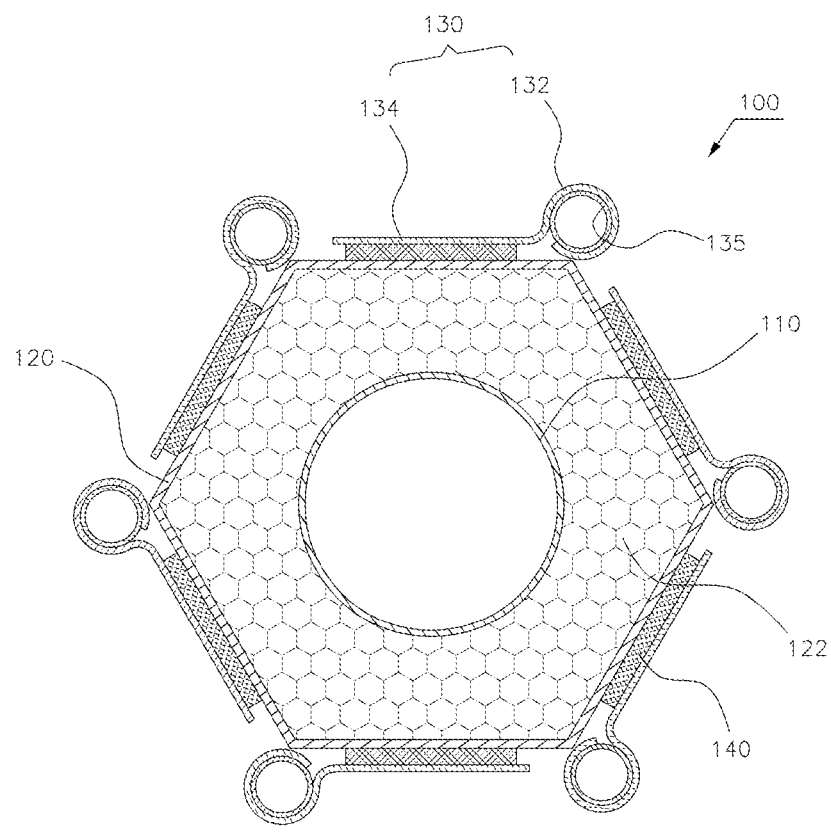
FIG. 3 is a cross sectional view of FIG. 2 cut through the line A-A'.

FIG. 2 is a perspective view of a thermoelectric generator of a vehicle according to an exemplary embodiment of the present invention, and FIG. 3 is a cross sectional view of FIG. 2 cut through the line A-A'. As illustrated, a thermoelectric generator of a vehicle 100 according to an exemplary embodiment of the present invention has the exhaust gas of the engine running through its inside and includes, a high temperature member 120, which works as the vehicle's silencer reducing the noise of the engine, low temperature members 130 installed outside the polygonal high temperature member 120, and a multitude of thermoelectric modules 140, which lies between the high temperature member 120 and the low temperature members 130, and which generates electricity using the temperature difference between the high temperature member 120 and the low temperature members 130.

The high temperature member 120 has a hexagonal cross section, and the high-temperature exhaust gas, which is emitted from the vehicle's engine, runs through its inside. The high temperature member 120 is made of a material with a large heat-transfer coefficient such as copper and is easily heated by the high-temperature exhaust gas running through its inside so it conveys thermal energy of the exhaust gas to the multitude of thermoelectric modules 140.

Figure 5:
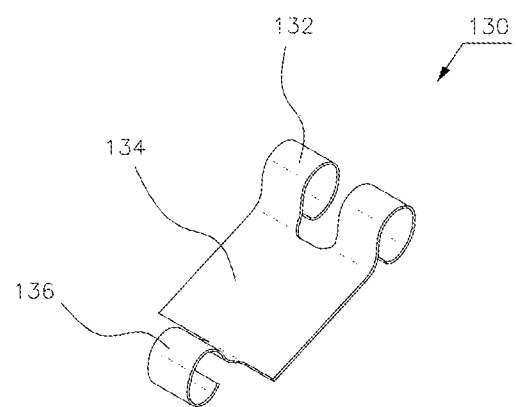
FIG. 5 is a perspective view of a low temperature member of a thermoelectric generator according to an exemplary embodiment of the present invention.

On each of the exterior of the high temperature member is installed the low temperature member. The low temperature member 130, as shown in FIG. 5, includes a first cooling pipe holder 132, which covers and supports cooling pipes, which coolant runs through, a heat transfer plate, which extends to the cooling pipe holder 132, and a second cooling pipe holder 136 formed on the heat transfer plate 134 and covers another cooling pipe 135.

The heat transfer plate 134 of a high temperature member is cooled by coolant, which runs inside the cooling pipe 135 as the first cooling pipe holder 132 and the second cooling pipe holder 136 come into contact with the cooling pipe 135. The heat transfer plate 134 and the first and the second cooling pipe holders 132, 134 are made of metals such as cooper, which has high heat conductivity, and the heat transfer plate 134 and the first and the second cooling pipe holders 132, 134 are formed as one body.

The low temperature member 130 lies between a coolant distribution member 133, which distributes the coolant to each cooling pipe 135, and a catchment member 137, which collects the coolant that passes through the cooling pipe 135. The low temperature member 130 is fixed on the exterior of the high temperature member 120 by a pair of clamps 116 lying between the coolant distribution member 133 and the coolant catchment member 137.

In a low temperature member 130 formed as described above, the coolant flows to the exit of the high temperature member 120 through the coolant distribution member 133 and runs through the cooling pipe 135. The coolant that passes through the cooling pipe 135 is collected at the entrance of the coolant catchment member 137 and is circulated by the coolant circulation system of the engine.

While the coolant passes through the cooling pipe 135, it cools down the heat transfer plate 134, and one side of the multitude of the thermoelectric modules 140 in contact with the heat transfer plate 134 is cooled down.

The multitude of thermoelectric modules includes a pair of terminals, each of which is connected to a P-typed semiconductor and an N-typed semiconductor respectively, as well as the semiconductor member, to which a P-typed semiconductor and an N-typed semiconductor are attached. Since the shape of the multitude of thermoelectric modules 140 is already publicly known, its detailed explanation is omitted here. The multitude of thermoelectric modules is interconnected to each other electrically and lies between each of the exterior sides of the high temperature member 120 and each of the heat transfer plates 134 to generate electricity using the thermoelectric phenomenon caused by the temperature difference between the high temperature member 120 and the low temperature members 130. The electricity generated by the multitude of thermoelectric modules 140 is used to charge the batteries of the vehicle.

One side of each of the multitude of thermoelectric modules 140 is attached to each of the exterior side of the high temperature member 120 by means of welding or a conductive tape, and the other side of each of the multitude of thermoelectric modules is attached to each of the interior side of the heat transfer plate 134 by means of welding or a conductive tape so that thermal energy of the high temperature member 120 is sufficiently conveyed.

In order to more efficiently convey thermal energy of the exhaust gas to the thermoelectric modules 140, as illustrated in FIG. 3, the high temperature member 120 includes a heat exchange mesh 122, which lies between the bypass pipe 110 and the high temperature member 120 itself and conveys thermal energy from the exhaust gas and the bypass pipe 110 to the thermoelectric modules 140, and a bypass valve 124, which is installed on the end of the bypass pipe 110 and controls the emission of the exhaust gas that is bypassed. The bypass valve 124 is installed on the end of the bypass pipe 110 by a spring 126. A spring 126 elastically supports the bypass valve 124 on the end of the bypass pipe 110.

The heat exchange mesh 122 has a hive-shaped cross section. By having the hive-shaped cross section, the heat exchange mesh 122 increases the contact area with the exhaust gas, and therefore, the heat exchange with the exhaust gas is activated even more. Thermal energy is exchanged with great efficiency to the heat exchange mesh 122 so the thermal energy of the exhaust gas is eventually conveyed to the high temperature member 120 connected with the heat exchange mesh 122. Thermal energy of the exhaust gas conveyed to the high temperature member 120 is conveyed to the multitude of the thermoelectric modules. Also, the noise of the engine in the process of the exhaust gas passing through the heat exchange mesh 122 is reduced.

When the temperature of the engine is low, i.e. when the temperature of the exhaust gas is lower than a predetermined degree, the bypass valve 124 is closed, and the exhaust gas flows outside the bypass pipe 110, i.e. in between the exterior of the bypass pipe 110 and the interior of the high temperature member 120. On the other hand, when the temperature of the exhaust gas is equal to or higher than the predetermined degree, the bypass valve 124 is opened, and the exhaust gas is bypassed to the exterior of the bypass pipe 110 and the bypass pipe 110 itself and is emitted outside.

Now, the application of a thermoelectric generator of a vehicle according to an exemplary embodiment of the present invention described above will be explained.

When the engine is run, the exhaust gas is emitted from the engine, and at the same time, it runs through the low temperature members 130 and the bypass pipe 110. At this moment, the temperature of the exhaust gas is low in general, so the bypass valve 124 is closed by the elasticity of the spring 126. Therefore, the exhaust gas cannot pass through the bypass pipe 110 and instead passes in between the exterior of the bypass pipe 110 and the high temperature member 120. The thermal energy of the exhaust gas is conveyed to the high temperature member 120 via the heat exchange mesh 122. At this moment, the exhaust gas passes through the little spaces formed in the heat exchange mesh 122, and hence, the noise of the engine is reduced.

Figure 4:
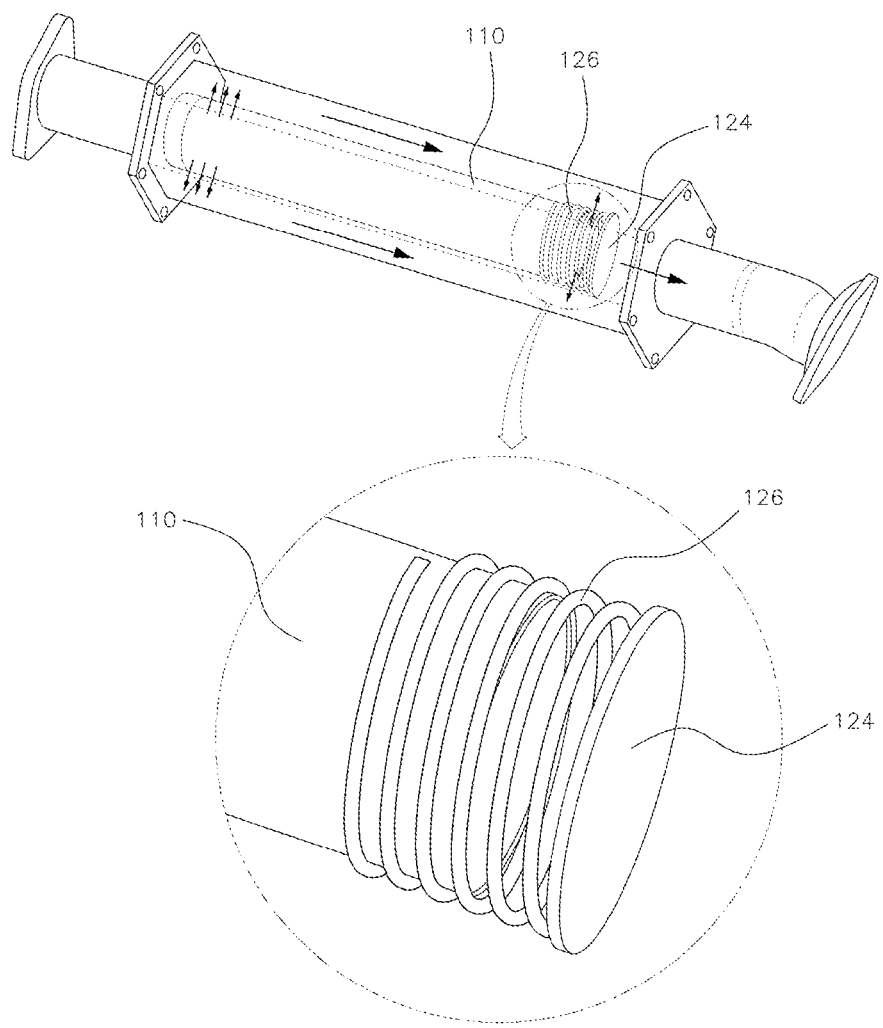
FIG. 4 is a cross sectional view of a bypass pipe and a variable valve of a thermoelectric generator according to an exemplary embodiment of the present invention.

When the temperature of the engine is high, i.e. when the engine runs at high RPM, the exhaust gas supplied through the bypass pipe 110 pushes the bypass valve 124 to beat the elasticity of the spring 126 and thus opens the bypass pipe 110 as shown in FIG. 4 to release the exhaust gas to the outside. In this case, the exhaust gas passes through the bypass pipe 110 and the heat exchange mesh 122, and thermal energy of the exhaust gas is conveyed to the multitude of thermoelectric modules. As the exhaust gas passes through the heat exchange mesh 122, the noise of the engine is reduced as well.

In an aspect of the present invention, the spring 126 may be made up of a shape memory wire such that the bypass pipe 110 may be selectively closed according to temperature of the exhaust gas.

Following phenomena take place at the multitude of thermoelectric modules 140 lying between the high temperature member 120 and the low temperature members 130. One side of the multitude of thermoelectric modules in contact with the high temperature member 120 is heated to a high temperature, and the other side of the multitude of thermoelectric modules in contact with the low temperature members 130 is cooled down to a low temperature.

Therefore, a temperature difference arises on both ends of the multitude of thermoelectric modules 140, and inside the multitude of thermoelectric modules 140 including a P-typed semiconductor and an N-typed semiconductor takes place a thermoelectric phenomenon so that electricity is generated. The generated electricity charges the vehicle's batteries electrically connected with the multitude of thermoelectric modules 140. As such, a vehicle's batteries can be charged using the vehicle's exhaust gas, which can generate electricity, and this helps increase the fuel efficiency.

Moreover, in accordance with a thermoelectric generator of a vehicle of an exemplary embodiment of the present invention, the thermoelectric efficiency is enhanced as the contact area between the high temperature member and the thermoelectric modules is large and the other side of the multitude of the thermoelectric modules is cooled down quickly by the low temperature members. Thus, a thermoelectric generator of a vehicle smaller than one by the prior art can be realized.

For convenience in explanation and accurate definition in the appended claims, the terms "upper", "lower", "inner" and "outer" are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A thermoelectric generator apparatus of a vehicle comprising;
   a high temperature member, through which exhaust gas passes;
   a plurality of low temperature members, which maintain a temperature lower than a temperature of the high temperature member, each of the low temperature members including a first coolant pipe holder supporting one coolant pipe of a plurality of coolant pipes, a heat transfer plate which extends from the first pipe holder and is located externally from the high-temperature member, and a second coolant pipe holder formed on an other side of the heat transfer plate and supporting another adjacent coolant pipe of the plurality of coolant pipes, a second coolant pipe holder of one of the lower temperature members and a first coolant pipe holder of an adjacent lower temperature member being coupled to a same coolant pipe; and thermoelectric modules disposed between the high temperature member and the low temperature members, the thermoelectric modules being formed by joining a P-typed semiconductor and an N-typed semiconductor and generate electricity using thermoelectric phenomenon caused by a temperature difference between the high temperature member and the low temperature members; and the high temperature member including a bypass pipe formed inside the high temperature member, and through which a part of the exhaust gas selectively bypasses a bypass valve installed in an end of the bypass pipe and controls a bypassed exhaust gas, a spring elastically biasing the bypass valve against the bypass pipe; and a heat exchange mesh positioned between the bypass pipe and the high temperature member, wherein the heat exchange mesh conveys the exhaust gas to an outside and thermal energy of the exhaust gas to the thermoelectric modules.

2. The thermoelectric generator apparatus of claim 1, wherein the spring is made up of shape memory wire.

3. The thermoelectric generator apparatus of claim 1, wherein the high temperature member has a polygonal cross section and the number of thermoelectric modules and the number of low temperature members are 6.

4. The thermoelectric generator apparatus of claim 1, wherein the bypass valve closes the bypass pipe when a temperature of the exhaust gas is lower than a predetermined degree, and opens the bypass pipe when the temperature of the exhaust gas is higher than the predetermined degree.

5. The thermoelectric generator apparatus of claim 1, wherein the coolant pipes are connected to a coolant distribution member and a coolant catchment member.

* * * * *